US 7,382,133 B1

(12) United States Patent
Morrone

(10) Patent No.: US 7,382,133 B1
(45) Date of Patent: Jun. 3, 2008

(54) SELF-SHIELDED GRADIENTS AND METHOD OF DESIGNING AND PRODUCING SELF-SHIELDED GRADIENTS

(75) Inventor: Terry Morrone, Melville, NY (US)

(73) Assignee: Fonar Corporation, Melville, NY (US)

( * ) Notice: Subject to any disclaimer, the term of this patent is extended or adjusted under 35 U.S.C. 154(b) by 84 days.

(21) Appl. No.: 11/413,269

(22) Filed: Apr. 28, 2006

Related U.S. Application Data

(60) Provisional application No. 60/676,069, filed on Apr. 29, 2005.

(51) Int. Cl.
*G01V 3/00* (2006.01)
(52) U.S. Cl. ...................................................... 324/318
(58) Field of Classification Search ......... 324/300–322
See application file for complete search history.

(56) References Cited

U.S. PATENT DOCUMENTS

| | | | |
|---|---|---|---|
| 4,733,189 A * | 3/1988 | Punchard et al. ........... 324/318 |
| 4,737,716 A | 4/1988 | Roemer et al. |
| 4,873,503 A | 10/1989 | Mansfield et al. |
| 4,896,129 A | 1/1990 | Turner et al. |
| 4,978,920 A | 12/1990 | Mansfield et al. |
| 5,266,913 A | 11/1993 | Chapman |
| 5,635,839 A * | 6/1997 | Srivastava et al. .......... 324/320 |
| 5,708,360 A * | 1/1998 | Yui et al. .................... 324/318 |
| 5,786,695 A * | 7/1998 | Amor et al. ................. 324/320 |
| 5,793,209 A * | 8/1998 | Kondo et al. ............... 324/318 |
| 5,998,998 A * | 12/1999 | Westphal .................... 324/318 |
| 6,049,207 A * | 4/2000 | Petropoulos ................ 324/318 |

* cited by examiner

*Primary Examiner*—Brij Shrivastav
*Assistant Examiner*—Dixomara Vargas
(74) *Attorney, Agent, or Firm*—IP Strategies

(57) ABSTRACT

A self-shielded gradient adapted to be disposed within a main magnet field of an MRI scanner includes a gradient coil having a shield current distribution $J_s$ based on current density components $\phi_n$ on a gradient surface where $$J_s = \sum_n a_n \phi_n.$$

The current distribution is a predetermined value within a volume defined by a periphery of the gradient coil. The current distribution is substantially zero outside the periphery of the gradient coil. According to a method of producing a self-shielded gradient, a shield current distribution $J_s$ is determined based on current density components $\phi_n$ on a gradient surface where $$J_s = \sum_n a_n \phi_n,$$

by using an optimization technique, and a gradient coil is constructed according to the shield current distribution. The current distribution is a predetermined value within a volume defined by a periphery of the gradient coil. The current distribution is substantially zero outside the periphery of the gradient coil.

45 Claims, 2 Drawing Sheets

SELF-SHIELDED GRADIENTS AND METHOD OF DESIGNING AND PRODUCING SELF-SHIELDED GRADIENTS

CROSS-REFERENCE TO RELATED APPLICATION

This claims priority under 35 USC §119(e) of U.S. Provisional Application for Patent No. 60/676,069, which was filed on Apr. 29, 2005.

FIELD OF THE INVENTION

The invention relates to self-shielded gradient coils used in MRI imaging systems, and to methods of designing and producing self-shielded gradient coils.

BACKGROUND OF THE INVENTION

Magnetic resonance imaging ("MRI") is one of the most versatile and fastest growing modalities in medical imaging. As part of the MRI process, the subject patient is placed in an external magnetic field. This field is created by a main magnet assembly, which can be either closed or open. Open magnet assemblies have two spaced-apart magnet poles separated by a gap, and a working magnetic field volume located within the gap.

Gradient coils located within the gap superimpose linear gradients on the main magnetic field. A gradient coil can include conductors fixed in appropriate locations, such as etched on a printed circuit board.

The diagnostic quality of images produced by MRI is directly related to several system performance characteristics. One very important consideration is the uniformity, or homogeneity, of the main magnetic field. In order to produce high-resolution images, the magnetic field produced in the MRI scanner must be maintained to a very high degree of uniformity.

Magnetic fields that vary linearly with distance are needed to make MRI images. Designing the main magnet structure such that the poles are close to the imaging volume, and therefore close to the gradient coils, enhances the efficiency of the magnet. However, as the gradient coils are placed closer to the main magnet poles, undesirable interactions occur between them, which can be further complicated by the necessity to switch the gradients on and off rapidly. Eddy currents induced in conductive materials surrounding the MRI apparatus produce unwanted non-uniform fields that distort the desired gradient fields in time and space.

To eliminate eddy currents, additional gradient coils typically are used to cancel the field at the surrounding conductive regions while preserving the linear gradient field. The additional coils are called shields and together with the primary coils constitute self-shielded gradients.

First described is a conventional method used to design self-shielded gradients. For simplicity, planar gradients are assumed, but the method applies to cylindrical gradients as well.

A primary current distribution is represented by a series of terms $$J_s = \sum_n a_n \phi_n(x, y),$$

where $\phi_n(x,y)$ are current distribution components at particular locations and $a_n$ are amplitudes of these components. Since J is a vector in a plane, the $\phi_n$ are vectors also. Each of the $\phi_n$ satisfies the continuity equation. $\phi_n(x,y)$ can be, for example, a two-dimensional Fourier series.

For each of the $\phi_n$, a current density on a shielding surface is calculated that, for an infinite surface, would produce zero field on the outer side of the shield. The outer side refers to the side farthest from the imaging volume, toward the magnet pole. See FIG. 1, which shows the relative positions of the magnet poles 1, the imaging volume 2, the primary gradient currents 3, and the gradient shield currents 4.

To get zero field on the outer side of the shield, a current density is placed on the shield that would result if the outer side consisted of a superconductive material. In such a material the field is zero. Thus, applying Ampere's Law results in a current density on the shield surface of $J=H_t$, where $H_t$ is the tangential component of the field of the primary coils.

Thus for each of the $\phi_n$, we have both a primary current distribution and a shield current distribution. If the shield could extend to infinity, shielding would be perfect.

Using some kind of optimization procedure, the $a_n$ are chosen such that a linear field is produced in the imaging volume. The $a_n$ can be chosen to give a linear field at a set of points (the target field approach) or the $a_n$ can null out non-linear components in an expansion representation of the field.

It would be advantageous to provide a method for producing a gradient field that is a substantially uniform gradient in the magnet gap and has a substantially zero value outside of a shield surface. It would also be advantageous to eliminate currents in the main magnet induced by the magnetic fields of the gradient coils.

BRIEF SUMMARY OF THE INVENTION

One aspect of the present invention is a method of designing and producing self-shielded gradients that are adapted to be disposed within a main magnet field of an MRI scanner and that provide improved shielding. According to the method, a shield current distribution $J_s$ is determined based on current density components $\phi_n$ on a gradient surface where $$J_s = \sum_n a_n \phi_n,$$

by using an optimization technique, and a gradient coil is constructed according to the shield current distribution. The current distribution is a predetermined value within a volume defined by a periphery of the gradient coil. The current distribution is substantially zero outside the periphery of the gradient coil.

For example, the gradient surface can be a plane, in which case each $\phi_n$ is $\phi_n(x,y)$, where x and y are Cartesian coordinates on the gradient surface. A corresponding primary gradient disposed within the main magnet field can have a surface that is planar, or it can have a surface that is not planar. For example, the corresponding primary gradient can have a surface that is a cylindrical section.

As an alternative example, the gradient surface can be a surface of a cylinder section, in which case each $\phi_n$ is $\phi_n(r,\theta)$, where r and θ are radial coordinates on the gradient surface representing the radius and angle of the position, respectively. A corresponding primary gradient disposed within the main magnet field can have a surface that is a cylindrical section, or it can have a surface that is not a cylindrical section. For example, the corresponding primary gradient can have a surface that is planar.

Determining the shield current distribution $J_s$ based on current density components $\phi_n$ of the primary current density can include determining a current density corresponding to each primary current density component such that a resulting gradient field is minimized on a pole of a main magnet generating the main magnet field. In this case, a current density can be determined corresponding to each current density component such that a resulting gradient field is minimized on shim bars disposed at outer edges of the pole.

Preferably, the shield current distribution is determined over a finite area.

If the gradient is oriented in the static field direction, the gradient currents can flow in at least one circular loop. In this case, determining a shield current distribution can include determining a current density for a single current loop such that the current density is zero except at a radius of the loop. The current density component can be determined such that $\phi_n = \delta(r-r_n)\hat{\phi}$, wherein $\delta$ is the delta function and $\hat{\phi}$ is a unit vector along a circle. Determining a shield current distribution can include individually determining a current density for each of a plurality of current loops. A current density can be interpolated for a loop having a general radius based on a continuous shield current distribution for the plurality of current loops. Preferably, these current loops are concentric, and the radii of the respective current loops are equally-spaced.

Current loops can be assembled that are optimized to provide a substantially uniform gradient, based on the interpolated current density. Gradient paths can be optimized for transverse gradients based on the interpolated current density. In this case, optimizing gradient paths can include optimizing positions of the gradient paths. Preferably, the gradient paths are optimized for a uniform gradient. The positions for the longitudinal gradients can also be optimized, as can the amplitudes $a_n$ for the transverse gradients.

According to another aspect of the invention, a self-shielded gradient adapted to be disposed within a main magnet field of an MRI scanner includes a gradient coil having a shield current distribution $J_s$ based on current density components $\phi_n$ on a gradient surface having any geometry, where $$J_s = \sum_n a_n \phi_n.$$

The current distribution is a predetermined value within a volume defined by a periphery of the gradient coil. The current distribution is substantially zero outside the periphery of the gradient coil.

For example, the gradient surface can be a plane, in which case each $\phi_n$ is $\phi_n(x,y)$, where x and y are Cartesian coordinates on the gradient surface. The self-shielded gradient in this case can also include a corresponding primary gradient disposed within the main magnet field that has a surface that is planar. Alternatively, the corresponding primary gradient can have a surface that is not planar, such as the surface of a cylindrical section.

Alternatively, the gradient surface can be a surface of a cylinder section, in which case each $\phi_n$ is $\phi_n(r,\theta)$, where r and $\theta$ are radial coordinates on the gradient surface representing the radius and angle of the position, respectively. A corresponding primary gradient disposed within the main magnet field can have a surface that is a cylindrical section, or it can have a surface that is not a cylindrical section. For example, the corresponding primary gradient can have a surface that is planar.

A current density can correspond to each current density component $\phi_n$ such that a resulting gradient field is minimized on a pole of a main magnet generating the main magnet field. The resulting gradient field can also be minimized on shim bars disposed at outer edges of the pole.

The shield current can be distributed over a predetermined area.

The gradient can be oriented along the static field direction. The gradient currents can flow in at least one circular loop. The shield current distribution can include a current density for a single current loop such that the current density is zero except at a radius of the loop. In this case, $\phi_n = \delta(r-r_n)\hat{\phi}$, wherein $\delta$ is the delta function and $\hat{\phi}$ is a unit vector along a circle. The shield current distribution can include individual current densities for each of a plurality of current loops. The plurality of current loops can be concentric, and the radii of the respective current loops can be equally-spaced. The current loops can be optimized to provide a substantially uniform gradient, according to an interpolated current density for a loop having a general radius based on a continuous shield current distribution for the plurality of current loops. Likewise, the gradient paths can be optimized for transverse gradients, according to an interpolated current density for a loop having a general radius based on a continuous shield current distribution for the plurality of current loops. The optimized gradient paths can include optimized positions of the gradient paths. The gradient paths can be optimized for a uniform gradient. Positions for the longitudinal gradients can be optimized, and the amplitudes $a_n$ can be optimized for the transverse gradients.

DETAILED DESCRIPTION OF THE INVENTION

The method of the invention is an improvement on the conventional procedure described above. Again, for simplicity, planar gradients are described, but the method applies to primary and shield gradients having other shapes as well, such as cylindrical gradients. Further, the primary gradients and the shields can have different geometries; for example, a cylindrical primary gradient need not be matched with a cylindrical shield, and instead can have a planar shield.

Instead of determining a shield current distribution corresponding to each of the $\phi_n$ using Ampere's Law, it is determined using an optimization technique. According to the preferred method, the shield current is represented by a finite series $$J_s = \sum_{n=1}^{N} b_n \theta_n(x, y),$$

and the coefficients $b_n$ are determined using a standard optimization program. That is, the shield current density corresponding to each $\phi_n$ is found such that the field is minimized on the poles of the magnet and at the outer edge of each pole, for example, at any shim bars disposed at the edges.

Thus, two optimizations preferably are utilized. The first optimization provides a shield current density distribution $\psi_n$ for each primary component of current density $\phi_n$. The second optimization provides amplitudes $a_n$ of the primary components that produce a uniform gradient, taking into account the shield components.

The method of the invention does not assume that an infinite sheet of current is available. Using conventional methods, the current density is truncated at the edge of the pole. Conventionally, the resulting shielding is very good near the center of the pole, but it breaks down near the edges. In contrast, according to the method of the invention it is assumed that a finite area exists where currents can flow, and the current density is optimized to satisfy the desired shielding criteria. The result is a better gradient.

Also according to the method of the invention, the optimization process is broken into parts, rather than optimizing the current on the primary and the shield together. Further, Ampere's Law is not used to determine shield currents.

Figure 1:
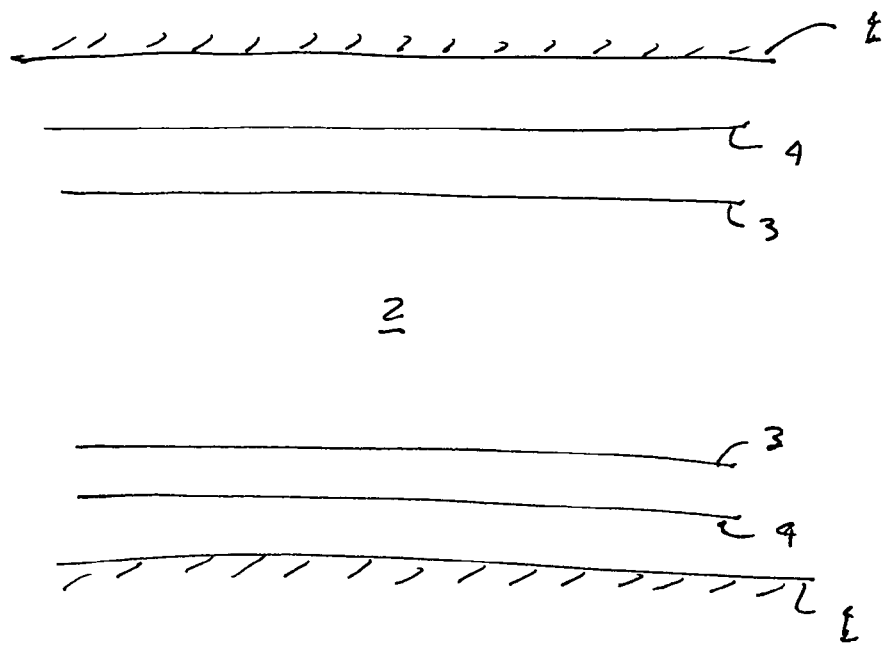
FIG. 1 is a diagram illustrating relative positions of the magnet poles and gradient currents.
Figure 2:
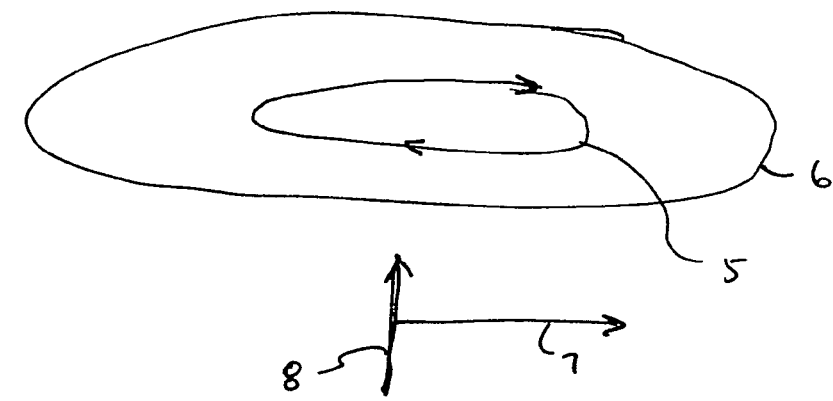
FIG. 2 is a diagram illustrating the orientation of longitudinal and transverse gradients between the main magnet poles.
Figure 2:
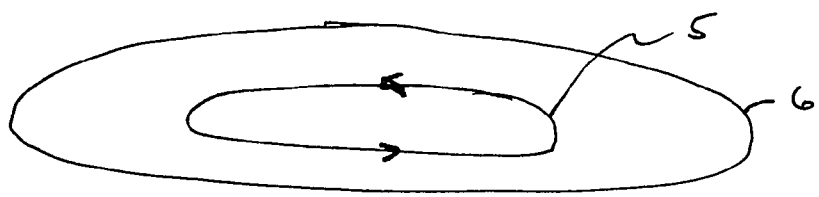

Referring to FIG. 2, for the gradient along the static field direction, the method can be modified. In this case, the currents flow in circular loops 5 at the poles 6. Instead of using a continuous current density $\phi_n(x,y)$, a single loop is used. It can be regarded as a special case of the former case where $\phi_n = \delta(r-r_n)\hat{\phi}$. That is, $\phi_n$ is zero everywhere except at $r_n$. $\delta$ a is the "delta" function. $\hat{\phi}$ is a unit vector along a circle. With this method, a continuous shield current distribution is found for many equally-spaced loops, which is interpolated to find the current density for a general radius. The positions of a group of loops are optimized to give a good gradient.

This modified method can also be used for the transverse gradients 7, where a set of gradient paths is created and their positions are optimized to give a uniform gradient. The positions for the longitudinal gradient 8 can be optimized and the coefficients $a_n$ can be optimized for the transverse gradients 7.

Figure 3:
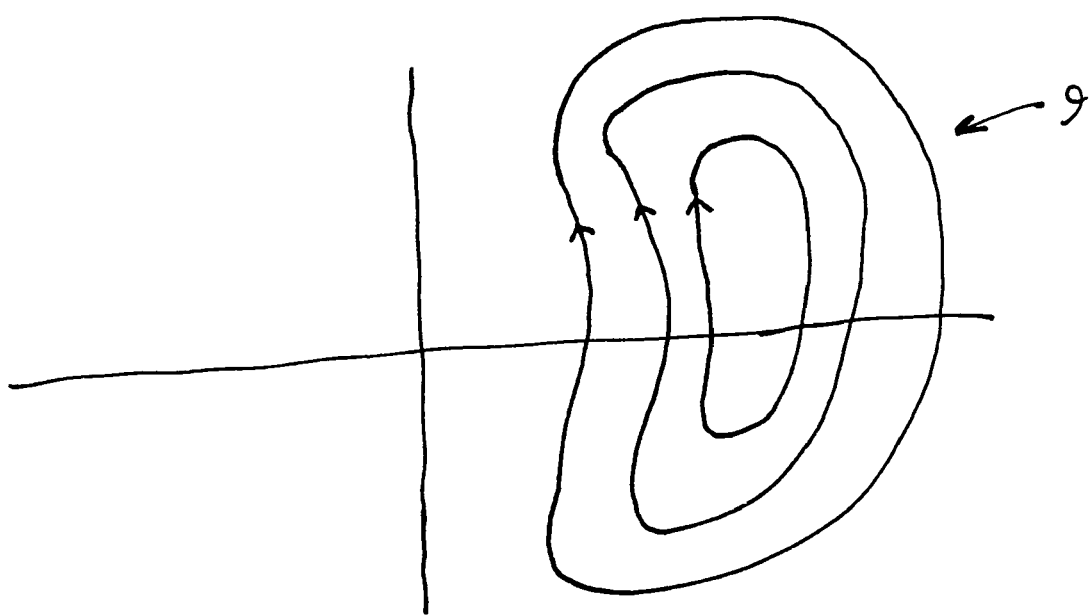
FIG. 3 is a diagram illustrating a family of current paths.

In this case, a family of current streamlines 9 is determined, as shown in FIG. 3, corresponding to an approximate current distribution. A streamline y(x) satisfies $$\left[\frac{dy}{dx} = \frac{J_y(x, y)}{J_x(x, y)}\right].$$

These streamlines are current paths analogous to the circular loops described above. The optimum shield current density is calculated for each current path and then the current path positions are determined that optimize the gradient.

I claim:

1. A method of producing a self-shielded gradient adapted to be disposed within a main magnet field of an MRI scanner, comprising:

determining a shield current distribution $J_s$ based on current density components $\phi_n$ on a gradient surface where $$J_s = \sum_n a_n \phi_n,$$

by using an optimization technique; and
constructing a gradient coil according to the shield current distribution;
wherein the current distribution is a predetermined value within a volume defined by a periphery of the gradient coil;
wherein the current distribution is substantially zero outside the periphery of the gradient coil;
wherein the gradient is oriented along the static field direction;
wherein the gradient currents flow in at least one circular loop; and
wherein determining a shield current distribution includes determining a current density for a single current loop such that the current density is zero except at a radius of the loop.

2. The method of claim 1, wherein the gradient surface is a plane, and each said $\phi_n$ is $\phi_n$ (x,y), where x and y are Cartesian coordinates on the gradient surface.

3. The method of claim 2, wherein a corresponding primary gradient disposed within the main magnet field has a surface that is planar.

4. The method of claim 2, wherein a corresponding primary gradient disposed within the main magnet field has a surface that is not planar.

5. The method of claim 4, wherein the corresponding primary gradient has a surface that is a cylindrical section.

6. The method of claim 1, wherein the gradient surface is a surface of a cylinder section, and each said $\phi_n$ is $\phi_n$ (r,θ), where r and θ are radial coordinates on the gradient surface representing the radius and angle of the position, respectively.

7. The method of claim 6, wherein a corresponding primary gradient disposed within the main magnet field has a surface that is a cylindrical section.

8. The method of claim 6, wherein a corresponding primary gradient disposed within the main magnet field has a surface that is not a cylindrical section.

9. The method of claim 8, wherein the corresponding primary gradient has a surface that is planar.

10. The method of claim 1, wherein determining the shield current distribution $J_s$ based on current density components $\phi_n$ includes determining a current density corresponding to each current density component such that a resulting gradient field is minimized on a pole of a main magnet generating the main magnet field.

11. The method of claim 10, further comprising determining a current density corresponding to each current density component such that a resulting gradient field is minimized on shim bars disposed at outer edges of the pole.

12. The method of claim 1, wherein the shield current distribution is determined over a finite area.

13. The method of claim 1, wherein $\phi_n = \delta(r-r_n)\hat{\phi}$, wherein $\delta$ is the delta function and $\hat{\phi}$ is a unit vector along a circle.

14. The method of claim 1, wherein determining a shield current distribution includes individually determining a current density for each of a plurality of current loops.

15. The method of claim 14, further comprising interpolating a current density for a loop having a general radius based on a continuous shield current distribution for the plurality of current loops.

16. The method of claim 15, wherein the plurality of current loops are concentric.

17. The method of claim 16, wherein the radii of the respective current loops are equally-spaced.

18. The method of claim 15, further comprising assembling current loops that are optimized to provide a substantially uniform gradient, based on the interpolated current density.

19. The method of claim 15, further comprising optimizing gradient paths for transverse gradients based on the interpolated current density.

20. The method of claim 19, wherein optimizing gradient paths includes optimizing positions of the gradient paths.

21. The method of claim 19, wherein the gradient paths are optimized for a uniform gradient.

22. The method of claim 19, further comprising optimizing positions for the longitudinal gradients.

23. The method of claim 22, further comprising optimizing the amplitudes $a_n$ for the transverse gradients.

24. A self-shielded gradient adapted to be disposed within a main magnet field of an MRI scanner, comprising:
a gradient coil having a shield current distribution $J_s$ based on current density components $\phi_n$ on a gradient surface where $$J_s = \sum_n a_n \phi_n;$$

wherein the current distribution is a predetermined value within a volume defined by a periphery of the gradient coil;
wherein the current distribution is substantially zero outside the periphery of the gradient coil;
wherein the gradient is oriented along the static field direction;
wherein the gradient currents flow in at least one circular loop; and
wherein the shield current distribution includes a current density for a single current loop such that the current density is zero except at a radius of the loop.

25. The self-shielded gradient of claim 24, wherein the gradient surface is a plane, and each said $\phi_n$ is $\phi_n(x,y)$, where x and y are Cartesian coordinates on the gradient surface.

26. The self-shielded gradient of claim 25, further comprising a corresponding primary gradient disposed within the main magnet field that has a surface that is planar.

27. The self-shielded gradient of claim 25, further comprising a corresponding primary gradient disposed within the main magnet field that has a surface that is not planar.

28. The self-shielded gradient of claim 27, wherein the corresponding primary gradient has a surface that is a cylindrical section.

29. The self-shielded gradient of claim 24, wherein the gradient surface is a surface of a cylinder section, and each said $\phi_n$ is $\phi_n(r,\theta)$, where r and $\theta$ are radial coordinates on the gradient surface representing the radius and angle of the position, respectively.

30. The self-shielded gradient of claim 29, further comprising a corresponding primary gradient disposed within the main magnet field that has a surface that is a cylindrical section.

31. The self-shielded gradient of claim 29, further comprising a corresponding primary gradient disposed within the main magnet field that has a surface that is not a cylindrical section.

32. The self-shielded gradient of claim 31, wherein the corresponding primary gradient has a surface that is planar.

33. The self-shielded gradient of claim 24, wherein a current density corresponds to each current density component $\phi_n$, such that a resulting gradient field is minimized on a pole of a main magnet generating the main magnet field.

34. The self-shielded gradient of claim 33, wherein a current density corresponds to each current density component such that a resulting gradient field is minimized on shim bars disposed at outer edges of the pole.

35. The self-shielded gradient of claim 24, wherein the shield current is distributed over a predetermined area.

36. The self-shielded gradient of claim 24, wherein $\phi_n = \delta(r-r_n)\hat{\phi}$, wherein $\delta$ is the delta function and $\hat{\phi}$ is a unit vector along a circle.

37. The self-shielded gradient of claim 24, wherein the shield current distribution includes individual current densities for each of a plurality of current loops.

38. The self-shielded gradient of claim 37, wherein the plurality of current loops are concentric.

39. The self-shielded gradient of claim 38, wherein the radii of the respective current loops are equally-spaced.

40. The self-shielded gradient of claim 37, wherein the current loops are optimized to provide a substantially uniform gradient, according to an interpolated current density for a loop having a general radius based on a continuous shield current distribution for the plurality of current loops.

41. The self-shielded gradient of claim 37, further comprising gradient paths that are optimized for transverse gradients, according to an interpolated current density for a loop having a general radius based on a continuous shield current distribution for the plurality of current loops.

42. The self-shielded gradient of claim 41, wherein the optimized gradient paths include optimized positions of the gradient paths.

43. The self-shielded gradient of claim 41, wherein the gradient paths are optimized for a uniform gradient.

44. The self-shielded gradient of claim 41, further comprising optimized positions for the longitudinal gradients.

45. The self-shielded gradient of claim 44, wherein the amplitudes $a_n$ are optimized for the transverse gradients.

* * * * *